(12) United States Patent
Huang et al.

(10) Patent No.: US 8,552,490 B2
(45) Date of Patent: Oct. 8, 2013

(54) NONVOLATILE MEMORY DEVICE WITH A HIGH-K CHARGE STORAGE LAYER HAVING A U-SHAPED, CROSS-SECTIONAL STRUCTURE

(75) Inventors: Chih-Jen Huang, Hsinchu (TW); Chien-Hung Chen, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 230 days.

(21) Appl. No.: 12/818,176

(22) Filed: Jun. 18, 2010

(65) Prior Publication Data

US 2011/0309434 A1    Dec. 22, 2011

(51) Int. Cl.
*H01L 29/792*    (2006.01)

(52) U.S. Cl.
USPC ............... 257/326; 257/E29.305; 438/288

(58) Field of Classification Search
USPC ............... 257/326, E29.305; 438/288
See application file for complete search history.

(56) References Cited

U.S. PATENT DOCUMENTS

| | | | |
|---|---|---|---|
| 3,878,549 A * | 4/1975 | Yamazaki et al. | 257/325 |
| 6,517,642 B2 * | 2/2003 | Horie et al. | 148/220 |
| 6,674,138 B1 | 1/2004 | Halliyal | |
| 6,864,139 B2 * | 3/2005 | Forbes | 438/275 |
| 7,005,348 B2 * | 2/2006 | Lee | 438/259 |
| 7,038,267 B2 * | 5/2006 | Chang et al. | 257/315 |
| 7,579,646 B2 * | 8/2009 | Wang et al. | 257/314 |
| 2005/0104112 A1 * | 5/2005 | Haukka et al. | 257/310 |
| 2006/0160303 A1 | 7/2006 | Ang | |
| 2007/0057318 A1 * | 3/2007 | Bach et al. | 257/324 |
| 2008/0128791 A1 * | 6/2008 | Lee et al. | 257/326 |
| 2009/0008702 A1 * | 1/2009 | Ramaswamy | 257/324 |

* cited by examiner

*Primary Examiner* — Stephen W Smoot
*Assistant Examiner* — Vicki B Booker
(74) *Attorney, Agent, or Firm* — Winston Hsu; Scott Margo (57) ABSTRACT

A nonvolatile memory device and a manufacturing method thereof are provided. The manufacturing method includes the following steps. First, a substrate is provided. Then, a tunneling dielectric layer is formed on the substrate, and a dummy gate is form on the tunneling dielectric layer. Subsequently, an interlayer dielectric layer is formed around the dummy gate, and the dummy gate is removed to form an opening. Following that, a charge storage layer is formed on the inner side wall of the opening, and the charge storage layer covers the tunneling dielectric layer. Moreover, an inter-gate dielectric layer is formed on the charge storage layer, and a metal gate is formed on the inter-gate dielectric layer. Accordingly, a stacked gate structure of the nonvolatile memory device includes the tunneling dielectric layer, the charge storage layer, the inter-gate dielectric layer, and the metal gate.

14 Claims, 5 Drawing Sheets

NONVOLATILE MEMORY DEVICE WITH A HIGH-K CHARGE STORAGE LAYER HAVING A U-SHAPED, CROSS-SECTIONAL STRUCTURE

BACKGROUND OF THE INVENTION

1. Field of the Invention

The present invention relates to a nonvolatile memory device and a manufacturing method thereof, and more particularly, to a nonvolatile memory device by integrating a gate last process and a high-K last process into the manufacturing method of the nonvolatile memory device.

2. Description of the Prior Art

Memory devices may be divided into volatile memory devices and nonvolatile memory devices. In the nonvolatile memory devices, storing data can persist even when power is turned off. This persistent characteristic makes the nonvolatile memory devices useful for data storage in applications such as mobile phones, digital cameras, video players, or personal digital assistants (PDA).

An e-fuse memory device is one of the nonvolatile memory devices. Take the e-fuse memory device as an example. The e-fuse memory device essentially includes at least an electrical fuse with a low electrical resistance. For example, the electrical fuse may be formed by a polysilicon layer disposed on a wafer. The electrical resistance of the electrical fuse may be increased or the conduction of the electrical fuse may be interrupted by a program process. For instance, the program process may be performed by applying a high voltage to the electrical fuse. After the program process, the electrical fuse with low electrical resistance may represent logic 0, and the electrical fuse with high electrical resistance may represent logic 1. Accordingly, the e-fuse memory device may serve as a nonvolatile memory device.

However, when a gate last process is performed on the wafer, the original polysilicon layer in the gate structure will be removed and can not be provided for the conventional e-fuse memory device. As a result, a new nonvolatile memory device is required to be integrated in the gate last process and to replace the conventional e-fuse memory device.

SUMMARY OF THE INVENTION

It is therefore one of the objectives of the present invention to provide a nonvolatile memory device and a manufacturing method thereof to overcome the problem and the limitation in the prior art.

According to a preferred embodiment of the present invention, a nonvolatile memory device is provided. The nonvolatile memory device includes a substrate, a first stacked gate structure, a source region, and a drain region. A memory cell region is defined on the substrate. The first stacked gate structure is disposed on the memory cell region of the substrate, and the first stacked gate structure from bottom to top sequentially includes a tunneling dielectric layer, a charge storage layer, an inter-gate dielectric layer, and a first metal gate. The source region and the drain region are disposed in the substrate and respectively disposed at two opposite sides of the first stacked gate structure.

According to a preferred embodiment of the present invention, a manufacturing method of a nonvolatile memory device is also provided. The manufacturing method includes the following steps. First, a substrate is provided. Then, a tunneling dielectric layer is formed on the substrate, and a dummy gate is form on the tunneling dielectric layer. Subsequently, an interlayer dielectric layer is formed around the dummy gate, and the dummy gate is removed to form an opening. Following that, a charge storage layer is formed on the inner side wall of the opening, and the charge storage layer covers the tunneling dielectric layer. Moreover, an inter-gate dielectric layer is formed on the charge storage layer, and a metal gate is formed on the inter-gate dielectric layer.

In the nonvolatile memory device and a manufacturing method thereof of the present invention, the first metal gate of the first stacked gate structure is configured to serve as a controlling gate, and the electrical resistance of the nonvolatile memory device can be effectively reduced. In addition, since the electrical resistance is decreased, the size of the nonvolatile memory device can be further reduced.

These and other objectives of the present invention will no doubt become obvious to those of ordinary skill in the art after reading the following detailed description of the preferred embodiment that is illustrated in the various figures and drawings.

DETAILED DESCRIPTION

In the following specifications and claims, certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". In addition, it should be noted that the diagrams are for explanations and are not drawn as original sizes or to scale.

Figure 1:
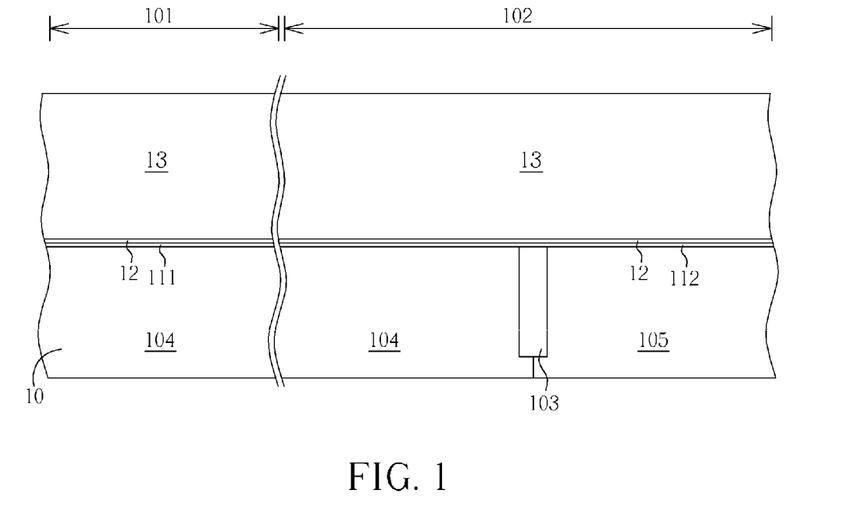
FIGS. 1-9 are schematic diagrams illustrating a manufacturing method of a nonvolatile memory device according to a first preferred embodiment of the present invention.

Please refer to FIGS. 1-9. FIGS. 1-9 are schematic diagrams illustrating a manufacturing method of a nonvolatile memory device according to a first preferred embodiment of the present invention. As shown in FIG. 1, a substrate 10 is initially provided. In this preferred embodiment, the substrate 10 is a semiconductor substrate, such as a silicon substrate, a silicon-containing substrate, or a silicon-on-insulator (SOI) substrate. But the substrate 10 is not limited herein and can be formed by other suitable materials. Moreover, a memory cell region 101 and a device region 102 are defined on the substrate 10. The memory cell region 101 may be configured to accommodate a plurality of memory cells, and the device region 102 may be configured to accommodate all kinds of controlling devices, such as peripheral circuits, or input/output (I/O) elements. In the following description, at least a memory cell is formed in the memory cell region 101, and at least an n-type metal-oxide-semiconductor (MOS) transistor and a p-type MOS transistor are formed in the device region 102. In addition, the substrate 10 includes at least an isolation region 103, such as a shallow trench isolation (STI) region. The isolation region 103 is configured to isolate different devices. Also, the substrate 10 further includes a p-type well 104 and an n-type well 105.

As shown in FIG. 1, a dielectric layer is then formed on the surface of the substrate 10. The dielectric layer disposed on the memory cell region 101 serves as a tunneling dielectric layer 111, and the dielectric layer disposed on the device region 102 serves as an input/output gate dielectric layer 112. It should be noted that since the tunneling dielectric layer 111 and the input/output gate dielectric layer 112 are different in the subsequent application, a thickness of the tunneling dielectric layer 111 may be thinner than a thickness of the gate dielectric layer 112 by adjusting parameters in the manufacturing process. In this preferred embodiment, the dielectric layer may include silicon dioxide or nitrogen silica. Furthermore, a barrier layer 12 may be selectively formed on dielectric layer to protect the dielectric layer in the following manufacturing process. Next, a polysilicon layer 13 is formed on the barrier layer 12. The polysilicon layer 13 is utilized as a sacrificial layer, which may include undoped polysilicon, doped polysilicon, amorphous silicon, other materials, or a combination thereof.

Figure 2:
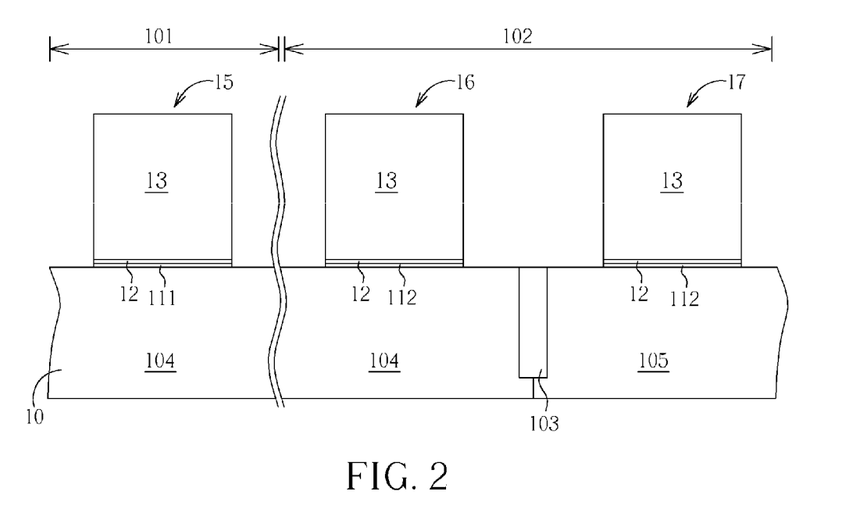

Following that, a patterned photoresist layer (not shown in the figure) is formed on the polysilicon layer 13. A pattern transfer process is performed by utilizing the patterned photoresist as a mask to remove a portion of the polysilicon layer 13, the barrier layer 12, the tunneling dielectric layer 111, and the gate dielectric layer 112 through single or multiple etching processes. Then, the patterned photoresist layer is removed. Accordingly, as shown in FIG. 2, a first dummy gate 15 is formed on the tunneling dielectric layer 111 in the memory cell region 101, and two second dummy gates 16, 17 are formed on the gate dielectric layer 112 in the device region 102.

Figure 3:
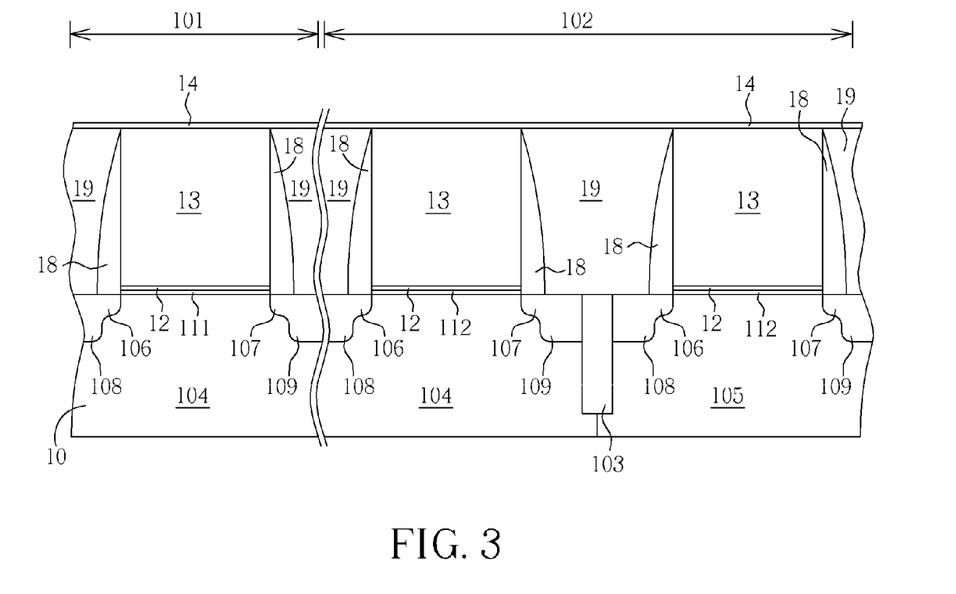

As shown in FIG. 3, a light doping process by utilizing at least a mask (not shown in the figure) is selectively performed to form a lightly doped source region 106 and a lightly doped drain region 107 in the substrate 10. For instance, in this preferred embodiment, n-type dopants are respectively implanted into the substrate 10 adjacent to two sides of the first dummy gate 15 and into the substrate 10 adjacent to two sides of the second dummy gate 16, and p-type dopants are implanted into the substrate 10 adjacent to two sides of the second dummy gate 17. Subsequently, at least a spacer 18 is formed on the sidewall of the first dummy gate 15 and on the sidewalls of two second dummy gates 16, 17. The spacer 18 may be single or multiple layers, which includes silicon oxide compounds, or silicon nitride compounds. The forming method of the spacer 18 may be a thermal oxidation process, or a chemical vapor deposition (CVD) process, or another appropriate process.

Moreover, after forming the spacer 18, an n-type heavy doping process and a p-type heavy doping process may be respectively performed to form the source region 108 and the drain region 109 by utilizing a different mask (not shown in the figure). The processes for forming the source region 108 and the drain region 109 are similar to the aforementioned light doping process but using higher doping concentration, so the description is omitted here. Furthermore, after finishing the doping of the source region and the drain region, an activation process, such as a rapid thermal process (RTP), may be selectively performed on the substrate 10. The purpose of the activation process is to activate the dopants implanted in the lightly doped source region 106, the lightly doped drain region 107, the source region 18, and the drain region 20. Also, the activation process may cure crystal damage on the surface of the substrate 10. Then, a salicide (self-aligned silicide) may be selectively performed.

Afterward, as shown in FIG. 3, an interlayer dielectric layer 19 is formed. For example, an interlayer dielectric material (not shown in the figure) may be completely deposited and may cover the first dummy gate 15 and the second dummy gates 16, 17. Next, a chemical mechanical polishing (CMP) process or an etching process is performed to remove a portion of the interlayer dielectric layer 19, such that the top of the polysilicon layer 13 is substantially even with the surface of the interlayer dielectric layer 19. The interlayer dielectric layer 19 may include oxide, nitride, carbide, low dielectric constant material, or a combination thereof. Subsequently, a mask layer 14 is completely formed, and the mask layer 14 may include silicon dioxide, silicon nitride, silicon oxynitride, silicon carbide, or a combination thereof.

Then, a patterned photoresist layer (not shown in the figure) may be formed to cover the region outside of the memory cell region 101. Following that, an etching process is performed to remove the mask layer 14 in the memory cell region 101 for exposing the polysilicon layer 13. Next, a dry etching process or a wet etching process is performed by using ammonium hydroxide (NH4OH) or tetramethylammonium hydroxide (TMAH) to remove the polysilicon layer 13 and the barrier layer 12 in the memory cell region 101 without etching the tunneling dielectric layer 111. Accordingly, as shown in FIG. 4, an opening 21 can be formed in the memory cell region 101.

Figure 4:
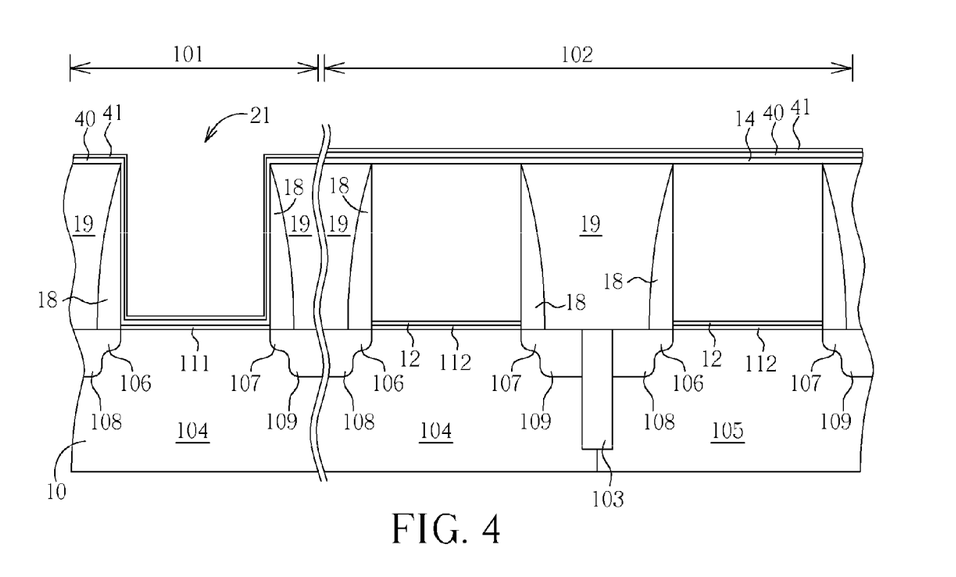

As shown in FIG. 4, a charge storage layer 40 is completely formed to cover the substrate 10. The charge storage layer 40 may include electrical conductive materials or electrical non-conductive materials. In this preferred embodiment, the charge storage layer 40 is composed of at least an electrical nonconductive material, and the charge storage layer 40 serves as a charge trap layer. Furthermore, the charge storage layer 40 of this preferred embodiment includes at least a high-K dielectric material, such as hafnium oxide ($HfO_2$), lanthanum oxide ($La_2O_3$), zirconium oxide ($ZrO_2$), cerium oxide ($CeO_2$), titanium dioxide ($TiO_2$), tungsten oxide ($WO_3$), tantalum oxide ($Ta_2O_5$), or a combination thereof. Accordingly, the charge storage layer 40 is disposed on the inner sidewall of the opening 21, and the charge storage layer 40 covers the tunneling dielectric layer 111. Furthermore, the charge storage layer 40 extends upwardly along a sidewall of the spacer 18 to form a U-shaped cross-sectional structure. Then, a silicone nitride layer 41 is selectively formed to cover the surface of the charge storage layer 40. Thus, the silicone nitride layer 41 also has a U-shaped cross-sectional structure similar to that of the charge storage layer 40. The silicone nitride layer 41 is utilized to protect the charge storage layer 40, so that the charge storage layer 40 will not be influenced by other materials, such as oxygen atoms.

Figure 5:
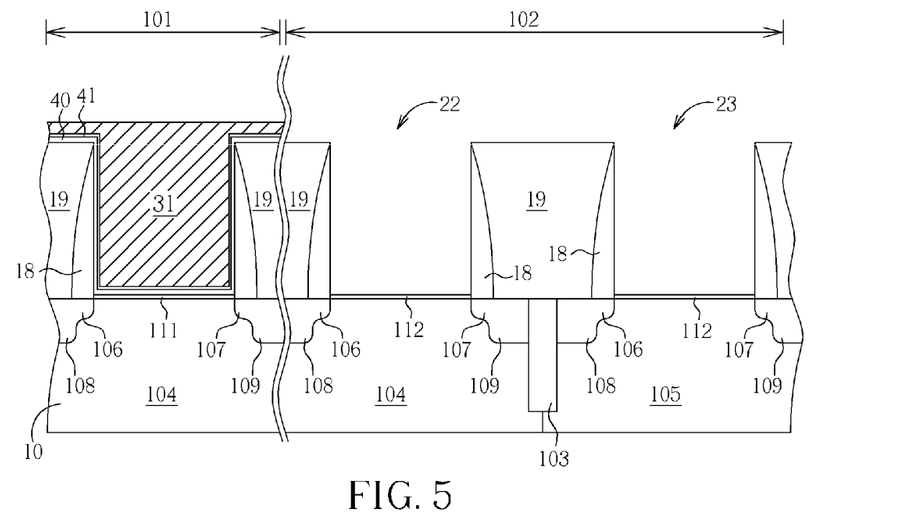

Thereafter, as shown in FIG. 5, a patterned photoresist layer 31 is formed to cover the memory cell region 101. An etching process is performed to remove the silicone nitride layer 41, the charge storage layer 40, and the mask layer 14 in the device region 102 for exposing the polysilicon layer 13 of the second dummy gates 16, 17. Next, the dry etching process or the wet etching process as described above is performed to remove the polysilicon layer 13 and the barrier layer 12 in the device region 102 without etching the gate dielectric layer 112, so that at least two openings 22, 23 are formed in the device region 102.

Figure 6:
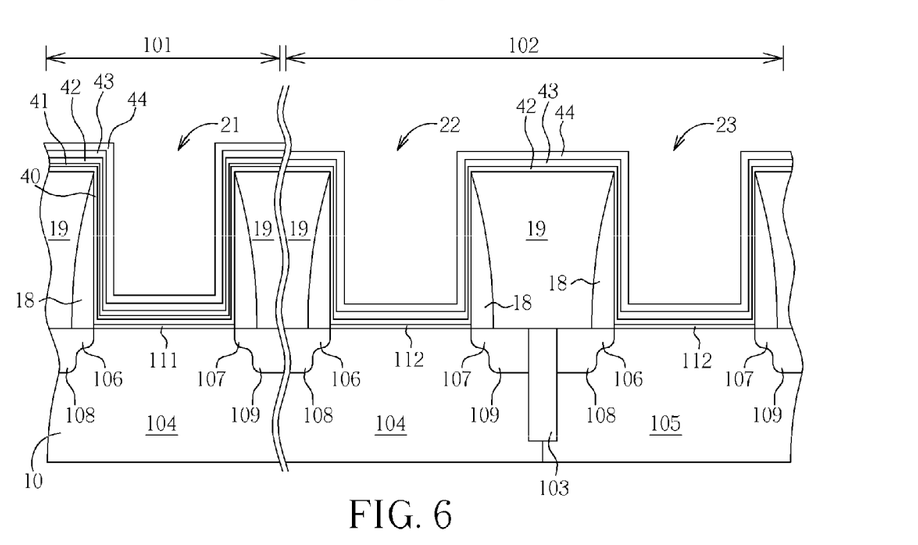

As shown in FIG. 6, the patterned photoresist layer 31 in FIG. 5 is removed, and a high-K dielectric layer 42 is completely deposited to cover the inner sidewalls of the openings 21, 22, and 23. In the same way, the material of the high-K dielectric layer 42 may include at least one of the aforementioned high-K dielectric materials, and repeated descriptions are not redundantly given. In this preferred embodiment, the silicone nitride layer 41 and the high-K dielectric layer 42 serve as the inter-gate dielectric layer in the memory cell region 101. In other words, the inter-gate dielectric layer includes the silicone nitride layer 41 and the high-K dielectric layer 42, and the high-K dielectric layer 42 covers the silicone nitride layer 41. Afterward, a titanium nitride layer 43 and a tantalum nitride layer 44 are sequentially deposited on the high-K dielectric layer 42.

Figure 7:
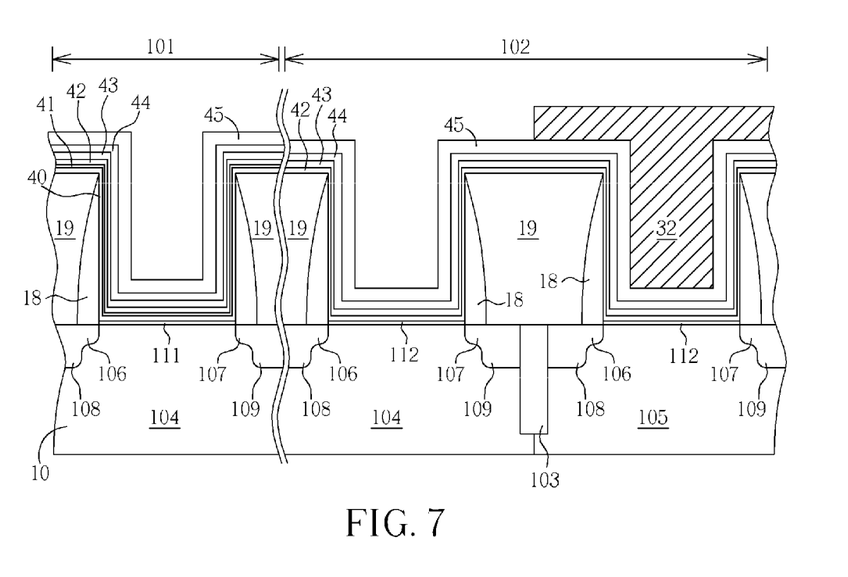
Figure 8:
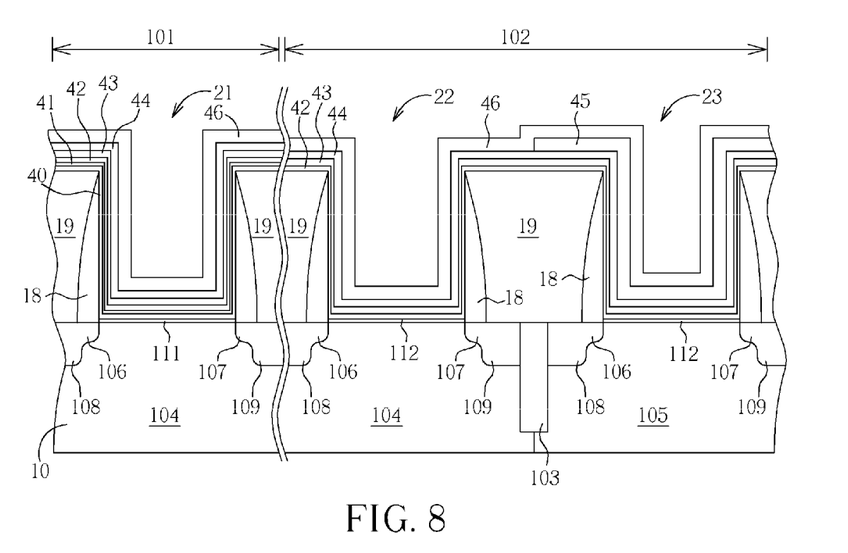

Following that, as shown in FIG. 7, a titanium nitride layer 45 is completely formed, and a patterned photoresist layer 32 is disposed on the titanium nitride layer 45 in a portion of the device region 102. More specifically, the patterned photoresist layer 32 exposes the memory cell region 101, and the patterned photoresist layer 32 also exposes a portion of the device region 102 for accommodating the p-type MOS transistor. As shown in FIG. 8, the titanium nitride layer 45 without being covered by the patterned photoresist layer 32 is first removed, and the patterned photoresist layer 32 is then removed. Next, a titanium aluminide layer 46 is completely formed. Accordingly, a barrier metal layer in the memory cell region 101 has been finished. The barrier metal layer from bottom to top sequentially includes the titanium nitride layer 43, the tantalum nitride layer 44, and the titanium aluminide layer 46. Also, a work function metal layer in the device region 102 has also finished. The work function metal layer disposed in the opening 22 is for n-type MOS transistor, and this work function metal layer from bottom to top sequentially includes the titanium nitride layer 43, the tantalum nitride layer 44, and the titanium aluminide layer 46. On the other hand, the work function metal layer disposed in the opening 23 is for p-type MOS transistor, and this work function metal layer from bottom to top sequentially includes the titanium nitride layer 43 (or a first titanium nitride layer), the tantalum nitride layer 44, a titanium nitride layer 45 (or a second titanium nitride layer), and the titanium aluminide layer 46. In this preferred embodiment, each layer in the work function metal layer also has a U-shaped cross-sectional structure.

It should be noted that an n-type channel is utilized in the memory cell disposed in the memory cell region 101 in this preferred embodiment. Thus, the barrier metal layer in the memory cell region 101 and the work function metal layer for the n-type MOS transistor in the device region 102 are manufactured together, and the work function metal layer for the p-type MOS transistor in the device region 102 is separately manufactured. But the present invention is not limited to this preferred embodiment. For example, the barrier metal layer in the memory cell region 101 and the work function metal layer of the p-type MOS transistor can be manufactured together.

Figure 9:
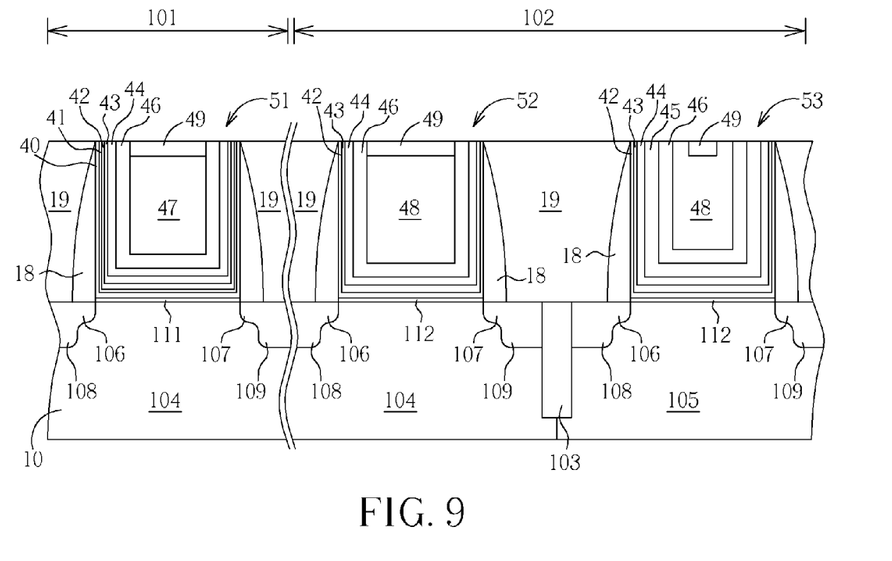

As shown in FIG. 9, a gate metal layer (not shown in the figure) is deposited to fill up the openings 21, 22, and 23, so that a first metal gate 47 can be formed in the memory cell region 101 and two second metal gates 48 can be formed in the device region 102. Moreover, a chemical mechanical polishing process or an etching process is performed to remove a portion of the gate metal layer, the barrier metal layer, the work function metal layer, the inter-gate dielectric layer, and the charge storage layer 40. Also, the materials inside the openings 21, 22, and 23 are substantially even with the surface of the interlayer dielectric layer 19. But the present invention is not limited to the aforementioned processes. For instance, before depositing the gate metal layer, a portion of the barrier metal layer, the work function metal layer, the inter-gate dielectric layer, and the charge storage layer 40 may be first removed. Then, the gate metal layer is deposited to fill up the openings 21, 22, and 23 for forming the first metal gate 47 and two second metal gates 48. In this preferred embodiment, the material of the gate metal layer may be aluminum. But it is not limited herein and may be other suitable metal material or electrical conductive material. Furthermore, an aluminum treatment may be performed to respectively form a titanium aluminum oxide (TiAlO) 49 on the top of the first metal gate 47 and on the tops of the second metal gates 48.

As shown in FIG. 9, the first stacked gate structure 51 in the memory cell region 101 has been finished, and two second stacked gate structures 52, 53 in the device region 102 have been finished. The first stacked gate structure 51 includes the tunneling dielectric layer 111, the charge storage layer 40, the inter-gate dielectric layer, the barrier metal layer, and the first metal gate 47; the second stacked gate structures 52, 53 respectively include the tunneling dielectric layer 111, the high-K dielectric layer 42, the work function metal layer, and the second metal gate 48. The second stacked gate structures 52, 53 have different work function metal layers. In addition, the barrier metal layer is disposed under the first metal gate 47. Also, the barrier metal layer extends upwardly along the sidewall of the first metal gate 47 to form a U-shaped cross-sectional structure. In the same way, the work function metal layer is also disposed under the second metal gate 48 and extends upwardly along the sidewall of the second metal gate 48. As a result, the first stacked gate structure 51 of the present invention may be configured to store one-bit or twin-bit data. Take the operation of storing twin-bit data as an example. By applying voltage to respectively drive electrons from the lightly doped source region 106 and the lightly doped drain region 10, the electrons may pass through the tunneling dielectric layer 111 and then may be trapped at two sides of the charge storage layer 40. More specifically, these two sides are respectively adjacent to the lightly doped source region 106 and the lightly doped drain region 107. Following that, electron trapping conditions at two sides of the charge storage layer 40 can be determined by the relation of electrical voltage and current between the source region and the drain region, so that the information of the storing data can be acquired.

Figure 10:
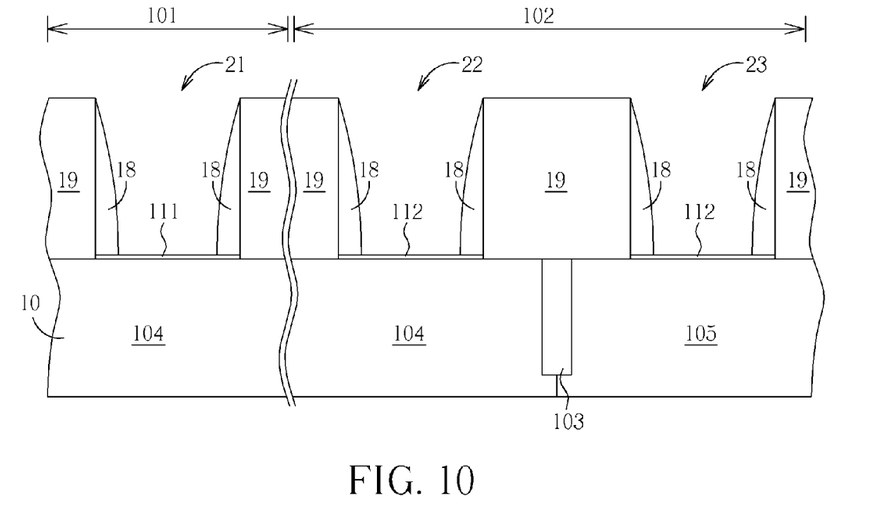
FIG. 10 is a schematic diagram illustrating a manufacturing method of a nonvolatile memory device according to a second preferred embodiment of the present invention.

The performing order of the aforementioned processes all can be changed or regulated according to the process requirement. For example, in the first preferred embodiment, the spacer 18 is formed around the dummy gate before forming the interlayer dielectric layer 19. But, in another embodiment, the processes order related to the spacer 18 can be altered. Please refer to FIG. 10. FIG. 10 is a schematic diagram illustrating a manufacturing method of a nonvolatile memory device according to a second preferred embodiment of the present invention. As shown in FIG. 10, in the second preferred embodiment, the interlayer dielectric layer 19 is directly formed on the sidewall of each dummy gate. Next, the dummy gates are removed to form a plurality of openings 21, 22, and 23 in the interlayer dielectric layer 19. Afterward, before forming the charge storage layer, at least a spacer is respectively formed on the inner sidewalls of the openings 21, 22, and 23. The following processes in the second preferred embodiment are substantially similar to that in the first preferred embodiment. That is, the charge storage layer, the inter-gate dielectric layer, the barrier metal layer, and the first metal gate are sequentially formed in the openings 21, 22, and 23, and repeated descriptions are not redundantly given.

In summary, the manufacturing method of the nonvolatile memory device of the present invention integrates the gate last process and the high-K last process. Also, in the nonvolatile memory device of the present invention, the first metal gate of the first stacked gate structure is configured to serve as a controlling gate, and the electrical resistance of the nonvolatile memory device can be effectively reduced. In addition, since the electrical resistance is decreased, the size of the nonvolatile memory device can be further reduced. Furthermore, the high-K dielectric layer serves as the charge storage layer in the present invention, so that the nonvolatile memory device can operate in low voltage with high electrical field.

Moreover, the first stacked gate structure disposed in the memory cell region and the second stacked gate structure disposed in the device region can be formed together to effectively save the manufacturing cost.

Those skilled in the art will readily observe that numerous modifications and alterations of the device and method may be made while retaining the teachings of the invention.

What is claimed is:

1. A nonvolatile memory device, comprising:
    a substrate, wherein a memory cell region is defined on the substrate;
    a first stacked gate structure, disposed on the memory cell region of the substrate, the first stacked gate structure from bottom to top sequentially comprising:
        a tunneling dielectric layer;
        a charge storage layer;
        an inter-gate dielectric layer, wherein the inter-gate dielectric layer covers the charge storage layer to form a U-shaped cross-sectional structure;
        a first metal gate having a first sidewall; and
        a barrier metal layer disposed between the first metal gate and the inter-gate dielectric layer, wherein the barrier metal layer is disposed under the first metal gate, and extends upwardly along the first sidewall of the first metal gate;
    a spacer disposed on the first sidewall of the first metal gate and overlapping the first sidewall, wherein the overlapped first sidewall is entirely surrounded by the inter-gate dielectric layer; and
    a source region and a drain region, disposed in the substrate and respectively disposed at two opposite sides of the first stacked gate structure.

2. The nonvolatile memory device of claim 1, wherein the charge storage layer comprises a high-K dielectric material.

3. The nonvolatile memory device of claim 1, wherein the charge storage layer covers the tunneling dielectric layer, and the charge storage layer extends upwardly along a spacer sidewall of the spacer.

4. The nonvolatile memory device of claim 1, wherein the inter-gate dielectric layer comprises a silicon nitride layer and a high-K dielectric layer, and the high-K dielectric layer covers the silicon nitride layer.

5. The nonvolatile memory device of claim 1, wherein the barrier metal layer from bottom to top sequentially comprises a titanium nitride layer, a tantalum nitride layer, and a titanium aluminide layer.

6. The nonvolatile memory device of claim 1, wherein the first metal gate comprises aluminum.

7. The nonvolatile memory device of claim 1, wherein a device region is defined on the substrate, and the nonvolatile memory device further comprises a second stacked gate structure disposed on the device region of the substrate.

8. The nonvolatile memory device of claim 7, wherein the second stacked gate structure from bottom to top sequentially comprises:
    a gate dielectric layer;
    a high-K dielectric layer;
    a work function metal layer; and
    a second metal gate, wherein the work function metal layer is disposed under the second metal gate, and the work function metal layer extends upwardly along a second sidewall of the second metal gate.

9. The nonvolatile memory device of claim 8, wherein the second metal gate is disposed between two portions of the high-K dielectric layer.

10. The nonvolatile memory device of claim 8, wherein the work function metal layer from bottom to top sequentially comprises a titanium nitride layer, a tantalum nitride layer, and a titanium aluminide layer, and the second metal gate comprises aluminum.

11. The nonvolatile memory device of claim 8, wherein the work function metal layer from bottom to top sequentially comprises a first titanium nitride layer, a tantalum nitride layer, a second titanium nitride layer, and a titanium aluminide layer, and the second metal gate comprises aluminum.

12. A manufacturing method of a nonvolatile memory device, comprising:
    providing a substrate, wherein a memory cell region is defined on the substrate;
    forming a first stacked gate structure disposed on the memory cell region of the substrate, wherein steps of forming the first stacked gate structure comprise:
        forming a tunneling dielectric layer on the substrate, and forming a dummy gate on the tunneling dielectric layer;
        forming a spacer on the dummy gate;
        forming an interlayer dielectric layer around the dummy gate, and removing the dummy gate to form an opening;
        forming a charge storage layer on an inner sidewall of the opening and on the tunneling dielectric layer;
        forming an inter-gate dielectric layer on the charge storage layer, wherein the inter-gate dielectric layer covers the charge storage layer to form a U-shaped cross-sectional structure; and
        forming a first metal gate having a first sidewall on the inter-gate dielectric layer, wherein the metal gate has a sidewall overlapped with the spacer, and the overlapped sidewall is entirely surrounded by the inter-gate dielectric layer;
        forming a barrier metal layer between the first metal gate and the inter-gate dielectric layer, wherein the barrier metal layer is under the first metal gate, and extends upwardly along the first sidewall of the first metal gate; and
    forming a source region and a drain region in the substrate, wherein the source region and the drain region are respectively disposed at two opposite sides of the first stacked gate structure.

13. The manufacturing method of claim 12, wherein the charge storage layer comprises a high-K dielectric material.

14. The manufacturing method of claim 12, wherein before the charge storage layer is formed, the manufacturing method further comprises forming a spacer on an inner sidewall of the opening.

* * * * *

UNITED STATES PATENT AND TRADEMARK OFFICE
CERTIFICATE OF CORRECTION

PATENT NO. : 8,552,490 B2
APPLICATION NO. : 12/818176
DATED : October 8, 2013
INVENTOR(S) : Chih-Jen Huang et al.

Page 1 of 1

It is certified that error appears in the above-identified patent and that said Letters Patent is hereby corrected as shown below:

On the title page, item (54) and in the specification, column 1, lines 1-4, correct the title of the invention from "NONVOLATILE MEMORY DEVICE WITH A HIGH-K CHARGE STORAGE LAYER HAVING A U-SHAPED,CROSS-SECTIONAL STRUCTURE" to
--NONVOLATILE MEMORY DEVICE WITH A HIGH-K CHARGE STORAGE LAYER HAVING A U-SHAPED, CROSS-SECTIONAL STRUCTURE AND MANUFACTURING METHOD THEREOF--.

Signed and Sealed this
Seventh Day of January, 2014

Margaret A. Focarino
*Commissioner for Patents of the United States Patent and Trademark Office*